United States Patent
Chu

(10) Patent No.: US 9,608,438 B2
(45) Date of Patent: Mar. 28, 2017

(54) INVERTER SYSTEM FOR PHOTOVOLTAIC POWER GENERATION

(71) Applicant: Electronics and Telecommunications Research Institute, Daejeon (KR)

(72) Inventor: Moo Jung Chu, Daejeon (KR)

(73) Assignee: ELECTRONICS AND TELECOMMUNICATIONS RESEARCH INSTITUTE, Daejeon (KR)

( * ) Notice: Subject to any disclaimer, the term of this patent is extended or adjusted under 35 U.S.C. 154(b) by 457 days.

(21) Appl. No.: 13/937,322

(22) Filed: Jul. 9, 2013

(65) Prior Publication Data

US 2014/0021793 A1    Jan. 23, 2014

(30) Foreign Application Priority Data

Jul. 17, 2012  (KR) .................. 10-2012-0077732
May 29, 2013  (KR) .................. 10-2013-0060992

(51) Int. Cl.
*H02J 1/00* (2006.01)
*H02J 1/10* (2006.01)
(Continued)

(52) U.S. Cl.
CPC .......... *H02J 1/00* (2013.01); *H01L 31/02021* (2013.01); *H02J 1/10* (2013.01);
(Continued)

(58) Field of Classification Search
CPC ..... H02J 1/00; H02J 1/10; H02J 3/383; H01L 31/02021; Y10T 307/696; Y02E 10/563
(Continued)

(56) References Cited

U.S. PATENT DOCUMENTS 8,716,891 B2    5/2014  Choi
2003/0227219 A1*  12/2003  Beck .............. H02J 3/383
                                                    307/38
(Continued)

FOREIGN PATENT DOCUMENTS

JP      2002-073184 A     3/2002
KR  10-2010-0133793 A    12/2010
(Continued)

*Primary Examiner* — Fritz M Fleming
*Assistant Examiner* — Thai Tran
(74) *Attorney, Agent, or Firm* — Rabin & Berdo, P.C.

(57) ABSTRACT

Provided is an inverter system capable of more economically and efficiently performing photovoltaic power generation by automatically switching an integrated operation and an independent operation of inverters according to voltage values and current values of photovoltaic panels without a separate communication function. The inverter system for photovoltaic power generation according to an exemplary embodiment of the present disclosure is an inverter system which changes direct current power output from a first photovoltaic panel and a second photovoltaic panel to alternating current power and includes: a first inverter and a second inverter, in which all of the outputs of the first and second photovoltaic panels are applied to the first inverter, or the output of the first photovoltaic panel is applied to the first inverter, and the output of the second photovoltaic panel is applied to the second inverter according to output values of the first and second photovoltaic panels.

6 Claims, 4 Drawing Sheets

(51) Int. Cl.
*H02J 3/38* (2006.01)
*H01L 31/02* (2006.01)

(52) U.S. Cl.
CPC .............. *H02J 3/383* (2013.01); *H02J 3/385* (2013.01); *Y02E 10/563* (2013.01); *Y02E 10/58* (2013.01); *Y10T 307/707* (2015.04)

(58) Field of Classification Search
USPC .......................................................... 307/82
See application file for complete search history.

(56) References Cited

U.S. PATENT DOCUMENTS

2009/0225574 A1* 9/2009 Fornage ................ H02M 3/335
363/123
2009/0283129 A1 11/2009 Foss
2010/0001587 A1 1/2010 Casey et al.
2010/0147362 A1* 6/2010 King ...................... F24J 2/4614
136/251
2010/0283325 A1 11/2010 Marcianesi et al.

FOREIGN PATENT DOCUMENTS

KR  10-2011-0068180 A  6/2011
KR  10-2012-0051185 A  5/2012

* cited by examiner

INVERTER SYSTEM FOR PHOTOVOLTAIC POWER GENERATION

CROSS-REFERENCE TO RELATED APPLICATIONS

This application is based on and claims priority from Korean Patent Application No. 10-2012-0077732, filed on Jul. 17, 2012, and Korean Patent Application No. 10-2013-0060992, filed on May 29, 2013, with the Korean Intellectual Property Office, the disclosure of which is incorporated herein in its entirety by reference.

TECHNICAL FIELD

The present disclosure relates to an inverter system for photovoltaic power generation, and more particularly, to an inverter system for operating small capacity inverters for photovoltaic power generation by a multi-central method.

BACKGROUND

An inverter in a photovoltaic power generation system serves to convert direct current (DC) power generated in a photovoltaic panel to alternating current (AC) power. The inverter starts an operation when direct current input power is equal to or larger than a predetermined level $W_{in\text{-}start}$ necessary for a normal operation, and stops for protection of a device when the direct current input power is equal to or larger than maximum input power $W_{in\text{-}max}$. The inverter stops the operation at minimum input power $W_{in\text{-}min}$. Here, values of the $W_{in\text{-}min}$ and the $W_{in\text{-}start}$ may be the same as or different from each other according to the inverter.

Efficiency of the inverter is defined as a ratio of input power to output power, and does not always have a uniform value through the whole operation range, and is changed according to the output as illustrated in FIG. 1. The efficiency of the inverter is different according to a structure and a control method, but it is generally known that the efficiency of the inverter is highest in a range from 30% to 80%.

The inverter of the photovoltaic power generation system may be divided into a module-integrated converter (MIC), a string inverter, a multi-string inverter, a central inverter, and a multi-central inverter according to a type of a combination of a photovoltaic panel and an array.

The MIC, which is a type of attaching an small inverter for each panel, has an advantage in that installing is easy because a separate DC line wiring is not necessary, and it is possible to harvest maximum energy even when daylight conditions between panels are different due to shadow or a difference in installation conditions, but has a disadvantage in that a cost burden is large when large capacity is implemented and efficiency is slightly lower than the large capacity inverter. The MIC starts to be supplied based on an advantage, such as flexibility and expandability of a panel arrangement in a small system, such as building integrated photovoltaics (BIPV), including a home system.

The string inverter method, which is a method using a DC/AC inverter for each serial panel group, may control maximum power point tracking (MPPT) for each string, and may relatively effectively harvest energy for a partial shadow. However, when the string inverter method is applied to a large capacity power plant, maintenance and repair costs are increased because the number of inverters is excessive, and the string inverter method is slightly inappropriate in an aspect of protection of a system, such as prevention of an isolated operation, because it is impossible to perform a central control of the inverter, such that the string inverter method is appropriate to a photovoltaic power generation system with a middle capacity.

The multi-string inverter method, which is a method using a DC/DC converter for each serial panel group, is a form including the advantages of the string method and the central method, but has a disadvantage in that efficiency of the system is slightly low due to the dual stage power conversion.

The central inverter method has a disadvantage in that energy harvest is slightly low due to a serial-parallel combination of all of the panels, but has an advantage in that efficiency of the converter is excellent, and costs compared to output capacity are low, so that the central inverter method is mainly used as a large capacity inverter method for industry. The central inverter method uses a single inverter, so that the central method has an advantage in that it is advantageous to protect the system and maintenance and repair costs are small, but has a disadvantage in that the whole system fails to be operated when the inverter fails. Recently, in order to supplement the aforementioned disadvantages, a multi-central inverter method of implementing one large capacity inverter system by connecting large capacity central inverters in parallel has been widely developed.

The inverter adopting the multi-central inverter method has a structure in which inverters adopting the central method are connected in parallel, and includes a plurality of inverters, not one inverter, when the power generation system is formed. The inverter is allowed to be operated under an optimum condition by operating only a specific inverter by collecting power generated in photovoltaic panels under a condition where photovoltaic energy is low, such as sunrise, sunset, and cloudy weather, and operating all of the plurality of inverters when photovoltaic energy is large, thereby improving efficiency of photovoltaic power generation equipment. The inverter adopting the multi-central method has an advantage in that the a use life of the inverter is extended by sequentially operating the inverters so that operating times of the inverters are equally maintained, and when one inverter fails, or is maintained and repaired, another inverter may be operated at a high energy level, so that it is possible to reduce energy loss, thereby starting to be supplied to a large-scale photovoltaic power generation system.

However, the multi-central inverter method needs to control the plurality of inverters and the photovoltaic panels, so that system building costs are increased, and a complex control function, including communication between the inverters or between the inverter and a central control device, is demanded, so that the multi-central inverter method is disadvantageously inappropriate to a small photovoltaic power generation system.

SUMMARY

The present disclosure has been made in an effort to provide an inverter system capable of more economically and efficiently performing photovoltaic power generation by automatically switching an integrated operation and an independent operation of inverters according to voltage values and current values of photovoltaic panels without a communication function when an MIC is used by a multi-central method.

An exemplary embodiment of the present disclosure provides an inverter system for photovoltaic power generation which changes direct current power output from a first photovoltaic panel and a second photovoltaic panel to alternating current power, the inverter system, the inverter system including: a first inverter and a second inverter, in which all of the outputs of the first and second photovoltaic panels are applied to the first inverter, or the output of the first photovoltaic panel is applied to the first inverter, and the output of the second photovoltaic panel is applied to the second inverter according to output values of the first and second photovoltaic panels.

In the inverter system according to the exemplary embodiment, when the output value of the first or second photovoltaic panel is smaller than a predetermined power value, all of the outputs of the first and second photovoltaic panels may be applied to the first inverter, and when the output value of the first or second photovoltaic panel is equal to or larger than the predetermined power value, the output of the first photovoltaic panel may be applied to the first inverter, and the output of the second photovoltaic panel may be applied to the second inverter.

The first inverter and the second inverter may be connected only with a power cable which is transmitting electric power.

The first inverter may include a first switch adopting an on/off method connected to the second photovoltaic panel in order to additionally receive the output of the second photovoltaic panel, and the second inverter may include a second switch connected between the second photovoltaic panel and the first inverter in order to receive the output of the second photovoltaic panel or switch the output of the second photovoltaic panel to the first inverter to apply the output.

The first inverter may include a first controller for controlling the first switch, and the second inverter may include a second controller for controlling the second switch.

The first and second controllers may control so that the first and second inverters are operated at a maximum power point by monitoring voltages and current input from the first and second photovoltaic panels.

When the output value of the second photovoltaic panel is smaller than a predetermined power value, the first controller may turn on the first switch, and the second controller may switch the second switch to the first inverter side, and when the output value of the second photovoltaic panel is equal to or larger than the predetermined power value, the first controller may turn off the first switch, and the second controller may switch the second switch to the second inverter side.

According to the exemplary embodiments of the present disclosure, a main inverter and a slave inverter are connected with each other only with a power line in photovoltaic power generation equipment installed by connecting a plurality of small inverters in parallel, so that outputs of two photovoltaic panels are combined in the main inverter to be operated when intensity of sunlight is weak, and the inverters are independently operated when the intensity of sunlight is strong, thereby extending a power generation time and simultaneously enabling each inverter to be operated in a range in which efficiency is the best.

A communication function between the inverters or between the inverters and a central control device is required in order to control the inverter in the operation of the existing multi-central inverter, but in the present disclosure, a separate communication device and a communication line are not necessary because an integrated operation and an independent operation are available by using output characteristics of the photovoltaic panels, thereby simplifying equipment and improving economical feasibility.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

The aforementioned objects, characteristics, and advantages will be described below with reference to the accompanying drawings, and thus those skilled in the art to which the present disclosure pertains will easily implement the technical spirit of the present disclosure. In the following description, a detailed explanation of known related functions and constitutions may be omitted so as to avoid unnecessarily obscuring the subject manner of the present disclosure. Hereinafter, an exemplary embodiment according to the present disclosure will be described with reference to the accompanying drawings in detail.

Figure 2:
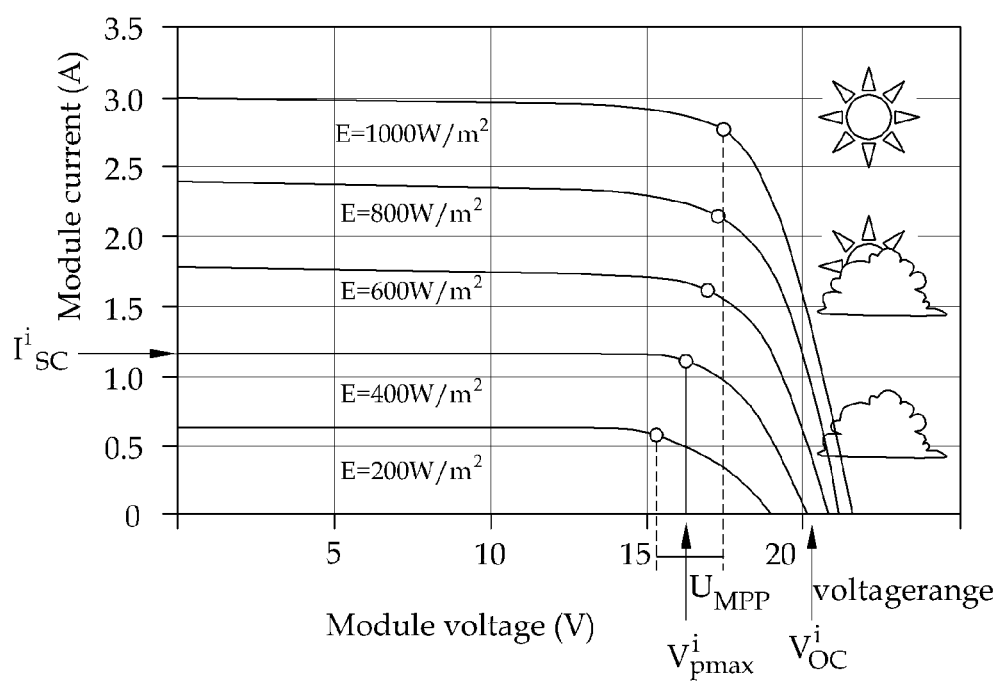
FIG. 2 is a graph illustrating a change in an output voltage, an output current characteristic, and a maximum power point of a general photovoltaic panel.

FIG. 2 illustrates a voltage-current output characteristic of a general photovoltaic panel. A density of photovoltaic energy is changed according to a time and a weather condition, and accordingly, an output of a photovoltaic panel is also changed. An inverter for photovoltaic power generation has a maximum power point tracking (MPPT) function in order to obtain maximum power, and adjusts a voltage-current output condition of the photovoltaic panel to a value at which maximum power may be generated according to a change in a density of photovoltaic energy.

Figure 1:
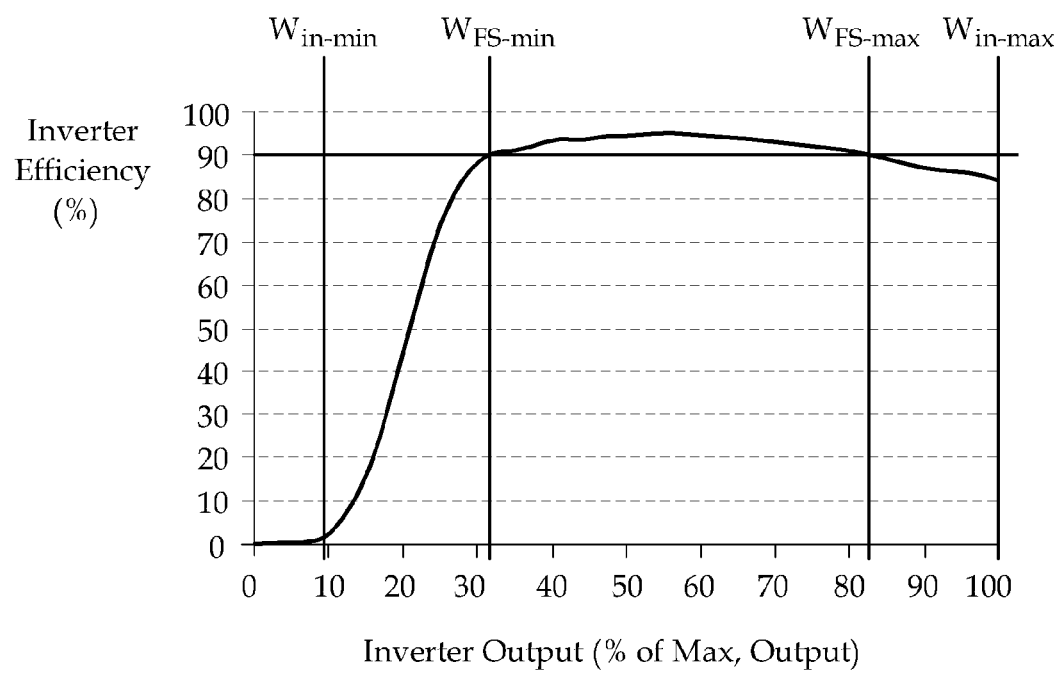
FIG. 1 is a graph illustrating a change in efficiency of a general photovoltaic inverter.

In this case, as illustrated in FIG. 1, when the inverter is operated in a section between $W_{FS\text{-}min}$ to $W_{FS\text{-}max}$ in which efficiency is high if possible, entire efficiency may be improved.

Figure 3:
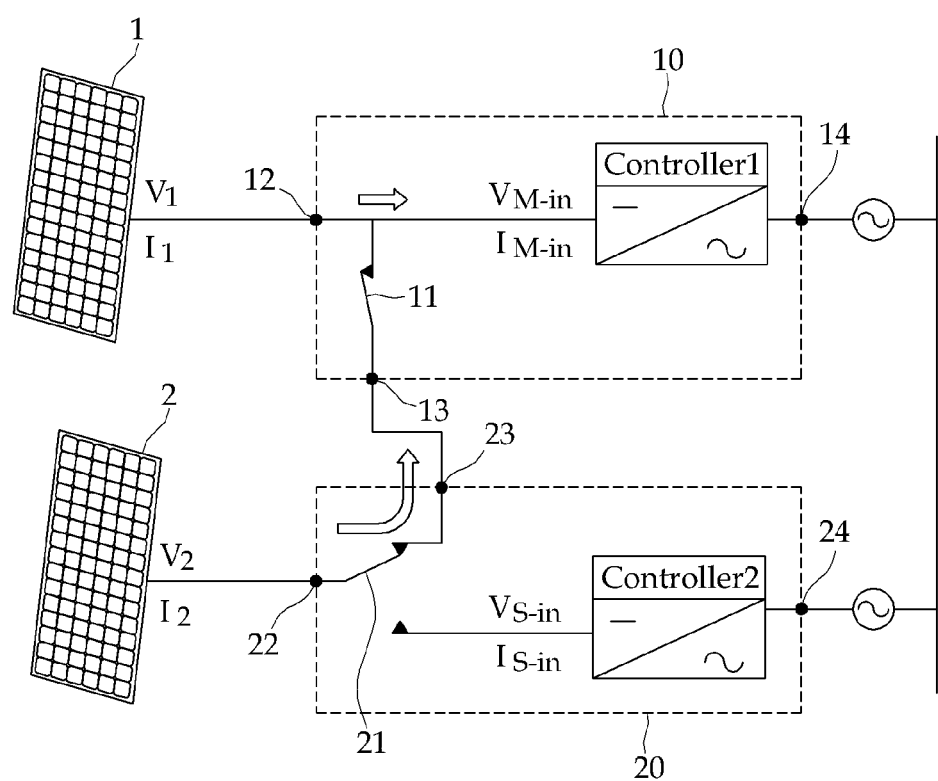
FIGS. 3 and 4 are configuration diagrams of an inverter system for photovoltaic power generation according to an exemplary embodiment of the present disclosure operated under different photovoltaic conditions.
Figure 4:
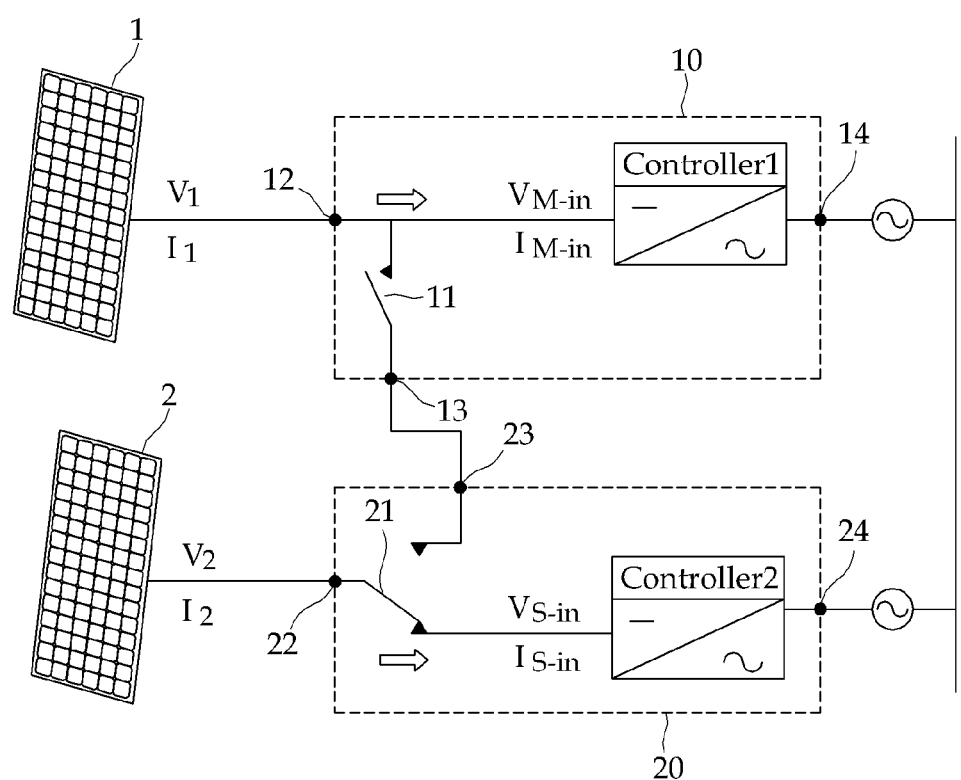

FIGS. 3 and 4 are configuration diagrams of an inverter system for photovoltaic power generation according to an exemplary embodiment of the present disclosure operated under different photovoltaic conditions.

Referring to FIGS. 3 and 4, the inverter system for photovoltaic power generation according to the exemplary embodiment of the present disclosure is an inverter system for changing direct current power output from a first photovoltaic panel 1 and a second photovoltaic panel 2 to alternating current power, and includes a first inverter 10 and a second inverter 20. In the inverter system according to the exemplary embodiment, all of the outputs of the first and second photovoltaic panels 1 and 2 are applied to the first inverter 10, or the output of the first photovoltaic panel 1 may be applied to the first inverter 10, and the output of the second photovoltaic panel 2 may be applied to the second inverter 20 according to output values of the first and second photovoltaic panels 1 and 2.

In the present exemplary embodiment, the first inverter 10 and the second inverter 20 make one pair to serve as a master inverter and a slave inverter, respectively.

The first and second inverters 10 and 20 include first and second controllers 1 and 2, respectively, and the first and second controllers 1 and 2 may control so that the respective inverters 10 and 20 are operated at a maximum power point by monitoring voltages and current input from the first and second photovoltaic panels 1 and 2.

When the output value of the first photovoltaic panel 1 is smaller than a predetermined power value, the first and second inverters 10 and 20 may make the outputs of all of the first and second photovoltaic panels 1 and 2 be applied to the first inverter 10 (an integrated operation), and when the output value of the first photovoltaic panel 1 is equal to or higher than the predetermined power value, the first and second inverters 10 and 20 may make the output of the first photovoltaic panel 1 be applied to the first inverter 10, and the output of the second photovoltaic panel 2 be applied to the second inverter 20 (an independent operation).

To this end, the first inverter 10 may include a first switch 11 adopting an on/off method connected to the second photovoltaic panel 2 in order to additionally receive the output of the second photovoltaic panel 2.

The second inverter 20 may include a second switch 21 connected between the second photovoltaic panel 2 and the first inverter 10 in order to receive the output of the second photovoltaic panel 2, or switch the output of the second photovoltaic panel 2 to the first inverter 10 to apply the output.

The first switch 11 may maintain an open state (off) as a basic value when a separate control is not performed by the first controller 1 of the first inverter 10, and the second switch 21 may maintain a state connected to the second inverter 20 as a basic value when a separate control is not performed by the second controller 2 of the second inverter 20.

Hereinafter, for simplification of the description of the technique, it is assumed that performance of the first and second photovoltaic panels 1 and 2 is the same, performance of the first and second inverters 10 and 20 connected to the first and second photovoltaic panels 1 and 2 is the same, and a maximum input of the inverter is matched to a maximum output of the photovoltaic panel. A change in an output of the photovoltaic panel according to a temperature change, contamination of the panel, and aged deterioration is not considered. Symbols for describing a characteristic and an operation of the inverter will be described below.

$W_{FS-min}$: Minimum output power set for an efficient operation of the inverter $W_{FS-max}$: Maximum output power set for an efficient operation of the inverter $W_{in-max}$: Maximum input power enabling the inverter to be normally operated $W_{in-min}$: Minimum input power enabling the inverter to normally continue an operation $W_{in-start}$: Minimum input power enabling the inverter to normally start an operation in a stop state $V_{M-max}$: Maximum input voltage of the first inverter 10

$I_{M-max}$: Maximum input current of the first inverter 10

$V_{M-in}$: Input voltage of the first inverter 10

$I_{M-in}$: Input current of the first inverter 10

$W_{M-in}$: Input power of the first inverter 10, $V_{M-in} \times I_{M-in}$ $V_{S-max}$: Maximum input voltage of the second inverter 20

$I_{S-max}$: Maximum input current of the second inverter 20

$V_{S-in}$: Input voltage of the second inverter 20

$I_{S-in}$: Input current of the second inverter 20

$W_{S-in}$: Input power of the second inverter 20, $V_{S-in} \times I_{S-in}$ $V^i_{OC}$: Open voltage of the photovoltaic panel (when a insolation condition is i)

$I^i_{SC}$: Short current of the photovoltaic panel (when a insolation condition is i)

$V^i_{pmax}$: Output voltage of the photovoltaic panel at a maximum power point (when a insolation condition is i)

$V^i_{pmax}$: Output of the photovoltaic panel at a maximum power point (when a insolation condition is i)

$V_1$: Output voltage of the first photovoltaic panel 1

$I_1$: Output current of the first photovoltaic panel 1

$W_1$: Output power of the first photovoltaic panel 1, $V_1 \times I_1$ $V_2$: Output voltage of the second photovoltaic panel 2

$I_2$: Output current of the second photovoltaic panel 2

$W_2$: Output power of the second photovoltaic panel 2, $V_2 \times I_2$

At a time zone from immediately after a sunrise to the morning in which an altitude of the sun is not high, as illustrated in FIG. 3, the second switch 21 is switched to the first inverter 10 side, and the first switch 11 is short (on). Accordingly, the first and second photovoltaic panels 1 and 2 are connected in parallel, and the output power of the second photovoltaic panel 2 is combined with the output of the first photovoltaic panel 1 while passing through from a DC output terminal 23 at an upper end of the second switch 21 to a DC input terminal 13 at a lower end of the first switch 11 to be applied to the first inverter 10. In this case, the power $W_{M-in}$ supplied to the first inverter 10 is $V_1 \times (I_1+I_2) = 2(V_1 \times I_1)$. Through this, the first inverter 10 may be operated when the output of each of the photovoltaic panels 1 and 2 is only equal to or larger than ½ of the minimum value $W_{in-min}$ at which the operation of the inverter is possible, so that it is possible to advance a power generation start time, and the inverter may be operated in an operation efficiency range higher than that of each independent operation.

When the outputs of the first and second photovoltaic panels 1 and 2 are increased to reach a range where the first inverter 10 and the second inverter 20 may be independently and efficiently operated according to the increase in the altitude of the sun, the first switch 11 is opened and the second switch 21 is switched to the second inverter 20 side as illustrated in FIG. 4. Accordingly, the first inverter 10 and the second inverter 20 may be separated and independently operated.

A time point for switching to the independent operation is determined by comparing the power value $V_{M-in}$ input in the first inverter 10 with the minimum power value $W_{FS-min}$ or the maximum power value $W_{FS-max}$ set for the efficient operation of the inverter.

That is, when the operation is switched to the independent operation in a case where $W_{M-in} > (2 \times W_{FS-min})$ and WM-in>$W_{FS-max}$, the operation is possible in a section in which efficiency of the first inverter 10 and the second inverter 20 is high.

When the first switch 11 is opened for the independent operation of the first inverter 10, the voltage $V_2$ of the second photovoltaic panel 2 is momentarily increased to the value of the open voltage $V^i_{OC}$. The second inverter 20 detects a value in the output voltage $V_2$ of the second photovoltaic panel 2 and a variation of the value of the output voltage $V_2$, and when it is determined that the first switch 11 is opened, the second inverter 20 switches the second switch 21 to the second inverter 20 side to start the independent operation.

Separately, the second inverter 20 may independently determine the start of the independent operation. In the normally operated system, the output voltage of the photovoltaic panel is maintained with $V^i_{pmax}$ by an MPPT function of the inverter. Accordingly, the output value $W_2 = W^i_{pmax}$ of the second photovoltaic panel 2 may be recognized from $V^i_{pmax}$. Otherwise, the output value $W_2 = V_2 \times I_2$ of the second photovoltaic panel 2 may also be obtained by simultaneously measuring the output current $I_2$ of the second photovoltaic panel 2. In a case where the output $W_2$ of the second photovoltaic panel 2 is $W_2>W_{FS-min}$ and $W_2>W_{FS-max}$, the second switch 21 is switched to the second inverter 20 side to start the independent operation.

When the altitude of the sun is decreased in the afternoon, as illustrated in FIG. 3, the outputs of the first and second photovoltaic panels 1 and 2 are integrated to the first inverter 10 again for the operation, thereby improving efficiency and extending a power generation time. When the input power $W_{M-in}$ of the first inverter 10 in the independent operation state is decreased to a range $W_{M-in}<W_{FS-min}$ equal to or smaller than a range in which the independent operation may be efficiently performed, the integrated operation of the first inverter 10 is prepared by making the first switch 11 be short. When the input power $W_{S-in}$ of the second inverter 20 in the independent operation state is decreased to a range $W_{S-in}<W_{FS-min}$ equal to or lower than a range in which the independent operation may be efficiently performed, the second switch 21 is switched to the first inverter 10 side.

In this case, when the first switch 11 is not short yet, the voltage $V_2$ of the second photovoltaic panel 2 is momentarily increased to the value of the open voltage $V^i{}_{OC}$, so that it is possible to identify whether the first switch 11 is short.

Another method of determining whether the first switch 11 is short is a method of identifying a voltage of the output terminal 23 output to the first inverter 10. Since the second switch 21 is switched to the second inverter 20 side in the state of the independent operation, and the first switch 11 is also in the open state, a voltage is not applied to the output terminal 23 of the second switch 21. When the integrated operation of the first inverter 10 is prepared, the first switch 11 is short, so that the output voltage $V_1$ of the photovoltaic panel 1 is detected in the output terminal 23 of the second switch 21. When it is detected whether the voltage exists, it is possible to identify whether the first switch 11 is opened.

In a state where the first switch 11 is the open state, the second inverter 20 continues the independent operation in a case where the second switch 21 is connected to the second inverter 20 side.

After it is identified that the first switch 11 is short by identifying the voltage of the output terminal 23 output to the first inverter 10, or a predetermined stand-by time elapses, the second switch 21 may be switched to the first inverter 10 side again. In a case where the first switch 11 is not short even though the switching operation of the second switch 21 is repeated by the predetermined number of times or more, or the input power $W_{S-in}$ is decreased to a value smaller than $W_{FS-min}$ by a predetermined level, it is determined that the first inverter 10 fails, and the independent operation may continue by fixing the second switch 21 to the second inverter 20 side.

When the switching is normally performed, the second inverter 20 stops the independent operation.

When the controllers 1 and 2 of the respective inverters 10 and 20 may automatically perform the aforementioned operation, it is possible to efficiently generate power even in a state where the amount of sunshine is smaller than that of an ordinary day, such as cloudy weather.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. An inverter system comprising:
   a first photovoltaic panel;
   a first inverter including a first switch and a first controller,
   wherein the first inverter is connected to the first photovoltaic panel;
   a second photovoltaic panel; and
   a second inverter including a second switch and a second controller, wherein the second inverter is connected to the second photovoltaic panel;
   wherein according to output values of the first and second photovoltaic panels, through on/off method of the first and second switches, all of the outputs of the first and second photovoltaic panels are applied to the first inverter, or the output of the first photovoltaic panel is applied to the first inverter and the output of the second photovoltaic panel is applied to the second inverter,
   wherein the first inverter and the second inverter are connected with a power cable,
   wherein the first and second switches are operated separately by the first and second controller,
   wherein the first inverter and the second inverter serve as a master inverter and a slave inverter, respectively,
   wherein in response to determining that the first inverter has failed, independent operation of the second inverter is performed by fixing a switch to a second inverter side, and
   wherein to determine whether the first inverter is in operation based on a switch state, a voltage of the second photovoltaic panel is temporarily increased to a value of a photovoltaic panel open voltage,
   wherein the first switch is located inside the first inverter and is connected to the second photovoltaic panel in order to additionally receive the output of the second photovoltaic panel, and
   the second switch is located inside the second inverter and is connected between the second photovoltaic panel and the first inverter in order to receive the output of the second photovoltaic panel or switch the output of the second photovoltaic panel to the first inverter to apply the output.

2. The inverter system of claim 1, wherein when the output value of the first photovoltaic panel is smaller than a predetermined power value, all of the outputs of the first and second photovoltaic panels are applied to the first inverter, and
   when the output value of the first photovoltaic panel is equal to or larger than the predetermined power value, the output of the first photovoltaic panel is applied to the first inverter, and the output of the second photovoltaic panel is applied to the second inverter.

3. The inverter system of claim 1, wherein when the output value of the second photovoltaic panel is smaller than a predetermined power value, all of the outputs of the first and second photovoltaic panels are applied to the first inverter, and
   when the output value of the second photovoltaic panel is equal to or larger than the predetermined power value, the output of the first photovoltaic panel is applied to the first inverter, and the output of the second photovoltaic panel is applied to the second inverter.

4. The inverter system of claim 1, wherein the first inverter and the second inverter are connected only with the power cable, which is transmitting electric power.

5. The inverter system of claim 1, wherein when the output value of the second photovoltaic panel is smaller than a predetermined power value, the first controller turns on the first switch, and the second controller switches the second switch to the first inverter side, and when the output value of the second photovoltaic panel is equal to or larger than the predetermined power value, the first controller turns off the first switch, and the second controller switches the second switch to the second inverter side.

6. The inverter system of claim 1, wherein the first and second controllers control so that the first and second inverters are operated at a maximum power point by monitoring voltages and current input from the first and second photovoltaic panels.

* * * * *